United States Patent
Ungureanu et al.

(10) Patent No.: US 11,442,087 B2
(45) Date of Patent: Sep. 13, 2022

(54) ADAPTIVE POWER MEASUREMENT ACCUMULATOR WITH A CHANGING SAMPLING FREQUENCY

(71) Applicant: Microchip Technology Incorporated, Chandler, AZ (US)

(72) Inventors: Razvan Ionut Ungureanu, Bucharest (RO); Thomas Anderson, Tucson, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 519 days.

(21) Appl. No.: 16/506,492

(22) Filed: Jul. 9, 2019

(65) Prior Publication Data

US 2020/0341039 A1  Oct. 29, 2020

Related U.S. Application Data

(60) Provisional application No. 62/838,460, filed on Apr. 25, 2019.

(51) Int. Cl.
  *G01R 22/06* (2006.01)
  *G01R 35/04* (2006.01)
  *H01M 10/48* (2006.01)

(52) U.S. Cl.
  CPC .......... *G01R 22/061* (2013.01); *G01R 35/04* (2013.01); *H01M 10/48* (2013.01)

(58) Field of Classification Search
  CPC ...... G01R 22/061; G01R 35/04; H01M 10/48
  USPC ...................................................... 702/179
  See application file for complete search history.

(56) References Cited

U.S. PATENT DOCUMENTS

| 4,795,974 A | 1/1989 | Landman et al. ............ 324/142 |
| 6,377,037 B1 | 4/2002 | Burns et al. .................. 324/142 |
| 2017/0097379 A1 | 4/2017 | Kern et al. ...................... 702/60 |
| 2017/0168118 A1* | 6/2017 | Rotem ............... G01R 31/3842 |
| 2020/0319690 A1* | 10/2020 | Sodhi ....................... G06F 1/28 |

FOREIGN PATENT DOCUMENTS

JP  2015231270 A  12/2015  ............... H02H 3/02

OTHER PUBLICATIONS

International Search Report and Written Opinion, Application No. PCT/US2019/057528, 18 pages, dated Feb. 6, 2020.

* cited by examiner

*Primary Examiner* — John H Le

(74) *Attorney, Agent, or Firm* — Slayden Grubert Beard PLLC

(57) ABSTRACT

A power meter includes a sampling circuit configured to initially make electrical measurements of a unit under test at a first sampling frequency. The power meter includes an adaptive circuit. The power meter includes an accumulator configured to accumulate electrical measurements of the unit under test from the sampling circuit. After a change in sampling frequency from the first sampling frequency to a second sampling frequency, the sampling circuit makes second electrical measurements at the second sampling frequency. The adaptive circuit is configured to adjust the second electrical measurements from the sampling circuit according to a factor. The factor is based on a relationship between the first sampling frequency and the second sampling frequency. The adjustment yields adjusted second electrical measurements. The accumulator is further configured to accumulate the adjusted second electrical measurements.

20 Claims, 4 Drawing Sheets

ADAPTIVE POWER MEASUREMENT ACCUMULATOR WITH A CHANGING SAMPLING FREQUENCY

APPLICATION PRIORITY

This application claims priority to U.S. Provisional Patent Application No. 62/838,460, filed Apr. 25, 2019, the contents of which are hereby incorporated in their entirety.

FIELD OF THE INVENTION

The present disclosure relates to the measurement of electrical power signals and, more particularly, to an adaptive power measurement accumulator with a changing sampling frequency.

BACKGROUND

Power meters are used to measure power in a variety of applications. Examples may include measuring power entering or discharging from a battery or portions of a mobile device, power converter, computer, tablet, phone, charger, adapter, or any other suitable electronic device. Power entering a battery, or power usage may be measured in various portions of such a device. In an electrical system, measuring the power consumed by, or provided for storage in, various system rails may provide information of vital system functions. Furthermore, by looking at real-time power consumption, a system can perform dynamic optimization to prolong battery life. Power meters may sample the voltage and current of a power rail repeatedly, at a sampling rate or frequency, and provide an instantaneous power measurement. Some power meters may include an accumulator arranged to accumulate instantaneous power measurements over time. While power meters are often used in systems that constantly monitor an instantaneous power of a system power rail, greater computation is required if average power is needed. To obtain an average power measurement, the instantaneous power readings are accumulated over a specified time interval by the accumulator, however additional processing is required in order to compute average power responsive to the accumulated instantaneous power measurements, which places a limitation on systems with limited processing capacity. For this reason, traditional power meters are not well suited for average power measurement, or for energy calculations. Such traditional power meters require the processing power of, for example, a central processing unit (CPU).

In order for a CPU to make a determination of energy provided to, or discharged from, a device, the determination of energy represented by accumulated instantaneous power measurements in a power meter, the CPU may require knowledge of a number of samples that were used to arrive at the accumulated power measurement. The CPU may then use the number of samples, a sampling frequency, and the accumulated power measurement from the power meter to determine the energy provided to, or discharged from, the device. However, inventors of embodiments as disclosed below have discovered that such a CPU must be interrupted when a sampling frequency of measurements has changed. When the power meter sampling frequency of measurements is changed but the change is not controlled by the CPU, the CPU must be interrupted from its current task and then account for the sampling frequency change for the computation of energy and average power. The CPU may in essence take two separate accumulated measurements from the power meter; a first accumulated measurement done with the first sampling frequency, and a second accumulated measurement at the second sampling frequency. The number of samples taken at the first and second sampling frequencies may be recorded. The CPU may further need to clear the accumulator and a sample counter when the sampling frequency of measurements is changed. The CPU must then determine the energy accumulated in the sensor from the separate first and second accumulated measurements. The CPU requires knowing what the change in sampling frequency was as well as when the sampling frequency changed. Embodiments of the present disclosure improve upon the shortcomings by preventing the CPU from requiring knowledge of when the sampling frequency changes as well as making separate energy determinations for differently sampled measurements.

SUMMARY

Embodiments of the present disclosure include an apparatus. The apparatus may include a sampling circuit configured to initially make electrical measurements of a unit under test at a first sampling frequency. The apparatus may include an adaptive circuit. The apparatus may include an accumulator configured to accumulate electrical measurements of the unit under test from the sampling circuit. After a change in sampling frequency from the first sampling frequency to a second sampling frequency, the sampling circuit may further make second electrical measurements at the second sampling frequency. The adaptive circuit may be configured to adjust the second electrical measurements from the sampling circuit according to a factor. The factor may be based on a relationship between the first sampling frequency and the second sampling frequency. The adjustment may yield adjusted second electrical measurements. The accumulator may be further configured to accumulate the adjusted second electrical measurements.

Embodiments of the present disclosure include a method. The method includes initially making electrical measurements of a unit under test at a first sampling frequency, accumulating electrical measurements of the unit under test, determining a change in sampling frequency from the first sampling frequency to a second sampling frequency, making second electrical measurements at the second sampling frequency after determining the change in sampling frequency, adjusting the second electrical measurements according to a factor, the factor based on a relationship between the first sampling frequency and the second sampling frequency, to yield adjusted second electrical measurements, and accumulating the adjusted second electrical measurements.

Embodiments of the present disclosure include a system. The system includes a processor and a power meter. The power meter includes a sampling circuit configured to initially make electrical measurements of a unit under test at a first sampling frequency, an adaptive circuit, and an accumulator configured to accumulate electrical measurements of the unit under test from the sampling circuit. After a change in sampling frequency from the first sampling frequency to a second sampling frequency, the sampling circuit is further configured to make second electrical measurements at the second sampling frequency. The adaptive circuit is configured to adjust the second electrical measurements from the sampling circuit according to a factor to yield adjusted second electrical measurements. The factor is based on a relationship between the first sampling frequency and the second sampling frequency. The accumulator is further configured to accumulate the adjusted second electrical measurements. The accumulator is configured to provide an accumulation of adjusted second electrical measurements to the processor.

DETAILED DESCRIPTION

Figure 1A:
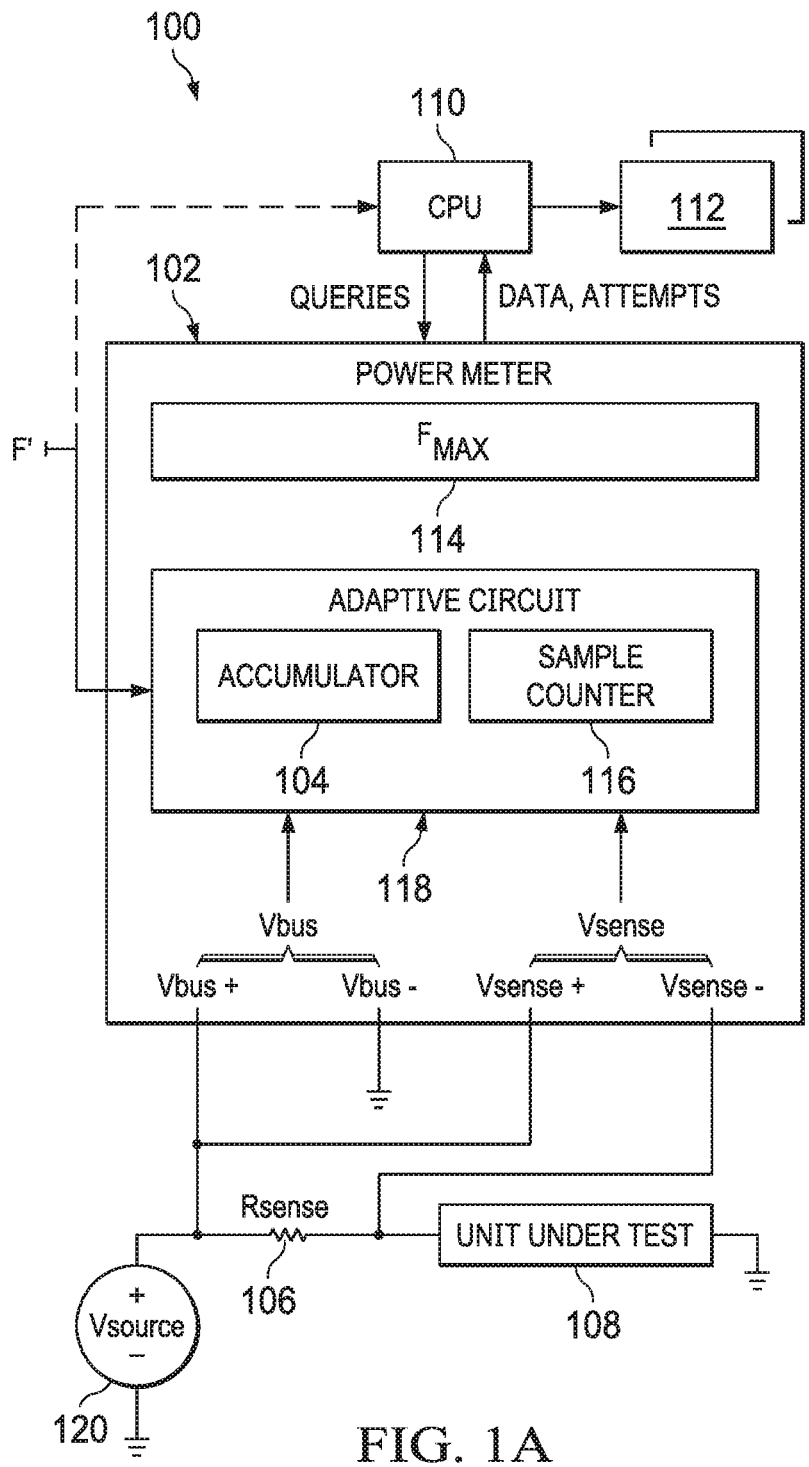
FIGS. 1A and 1B are illustrations of a system for adaptive power measurement accumulation with a changing sampling frequency, according to embodiments of the present disclosure.

Embodiments of the present disclosure include a power meter. The power meter may include a sampling circuit configured to initially make electrical measurements of a unit under test at a first sampling frequency. The power meter may include an adaptive circuit. The adaptive circuit may be implemented by any suitable mechanism, and may include one or more adjustment circuits configured to adjust the electrical measurements or a sample count of the electrical measurements. The power meter may include an accumulator configured to accumulate electrical measurements of the unit under test from the sampling circuit. The accumulator may be implemented by any suitable mechanism. After a change in sampling frequency from the first sampling frequency to a second sampling frequency, the sampling circuit may further make second electrical measurements at the second sampling frequency. The adaptive circuit may be configured to adjust the second electrical measurements from the sampling circuit according to a factor. The factor may be based on a relationship between the first sampling frequency and the second sampling frequency. The adjustment may yield adjusted second electrical measurements. The accumulator may be further configured to accumulate the adjusted second electrical measurements. The first and second frequencies may be any suitable frequencies.

In combination with any of the above embodiments, any suitable electrical measurements may be collected. The electrical measurements may include voltage measurements, current measurements, power measurements, or manipulations of such measurements as part or all of a process to yield information from other measurements. For example, the electrical measurements may be scaled, filtered, or used in steps of calculations. In a further example, such calculations may include a power product, wherein one voltage measurement may be multiplied by another voltage measurement, wherein the power product may be further used to calculate power once the power product is divided by a resistance value. The electrical measurements may be stored in the accumulator, which may be implemented by any suitable mechanism. The electrical measurements may be of the unit under test, or of components connected to the unit under test.

In combination with any of the above embodiments, a sample count may be collected. The sample count may accumulate a number of samples that have been used to take the electrical measurements. The sample count may be stored in any suitable mechanism.

In combination with any of the above embodiments, a processor may be configured to access the power meter. The processor may be implemented by any suitable processor, microcontroller, central processing unit, application specific integrated circuit, or field programmable gate array. The processor may be configured to access the power meter to start taking measurements, stop taking measurements, or access data collected by the power meter.

In combination with any of the above embodiments, the accumulator may be further configured to accumulate the adjusted second electrical measurements made at the second sampling frequency with the first electrical measurements made at the first sampling frequency without resetting a value of the accumulator. The first and second electrical measurements may be accumulated into a single value. The single value may be reported to the processor.

In combination with any of the above embodiments, the power meter may further include a sample counter. The sample counter may be implemented in any suitable manner. The sample counter may be configured to initially accumulate a count of electrical measurements made by the sampling circuit at the first sampling frequency. After a change from the first sampling frequency to the second sampling frequency, the sample counter may be configured to further accumulate the count of electrical measurements made by the sampling circuit at the second sampling frequency. The count of power measurements made by the sampling circuit at the second sampling frequency may be adjusted by the factor. The adjustment to the count of power measurements may be made by any suitable mechanism. The adjustment to the count of power measurements may be made by a same or a different adjustment circuit as is configured to adjust the electrical measurements.

In combination with any of the above embodiments, the adaptive circuit may be further configured to receive an indication that electrical measurements are to be made at the second sampling frequency instead of the first sampling frequency. The indication may be of any suitable form. The indication may be a signal routed from any suitable source. The indication may indicate a particular second frequency to use, or may be a binary signal to specify to switch to a second, different frequency. The indication may also be sent to the processor. However, the processor might not require such an indication to adjust values of the accumulator or the sample count.

In combination with any of the above embodiments, the adaptive circuit may be further configured to receive the indication that electrical measurements are to be made at the second sampling frequency instead of the first sampling frequency without notification to software on the processor configured to use a value of the accumulator.

In combination with any of the above embodiments, the accumulator may be further configured to provide a single value of accumulated electrical measurements, the accumulated electrical measurements including electrical measurements made with both the first sampling frequency and the second sampling frequency. The single value may be provided to the processor.

In combination with any of the above embodiments, the adaptive circuit may include a shift circuit to implement an adjustment circuit. The factor ("S") may be an exponent of a base of two, wherein $2^S$ is equal to a ratio of the first sampling frequency to the second sampling frequency. The shift circuit may be configured to shift an accumulated value of electrical measurements by S bits. The shift circuit may be a left shift circuit. The sample count may be incremented by S for each electrical measurement that is taken.

Figure 1B:
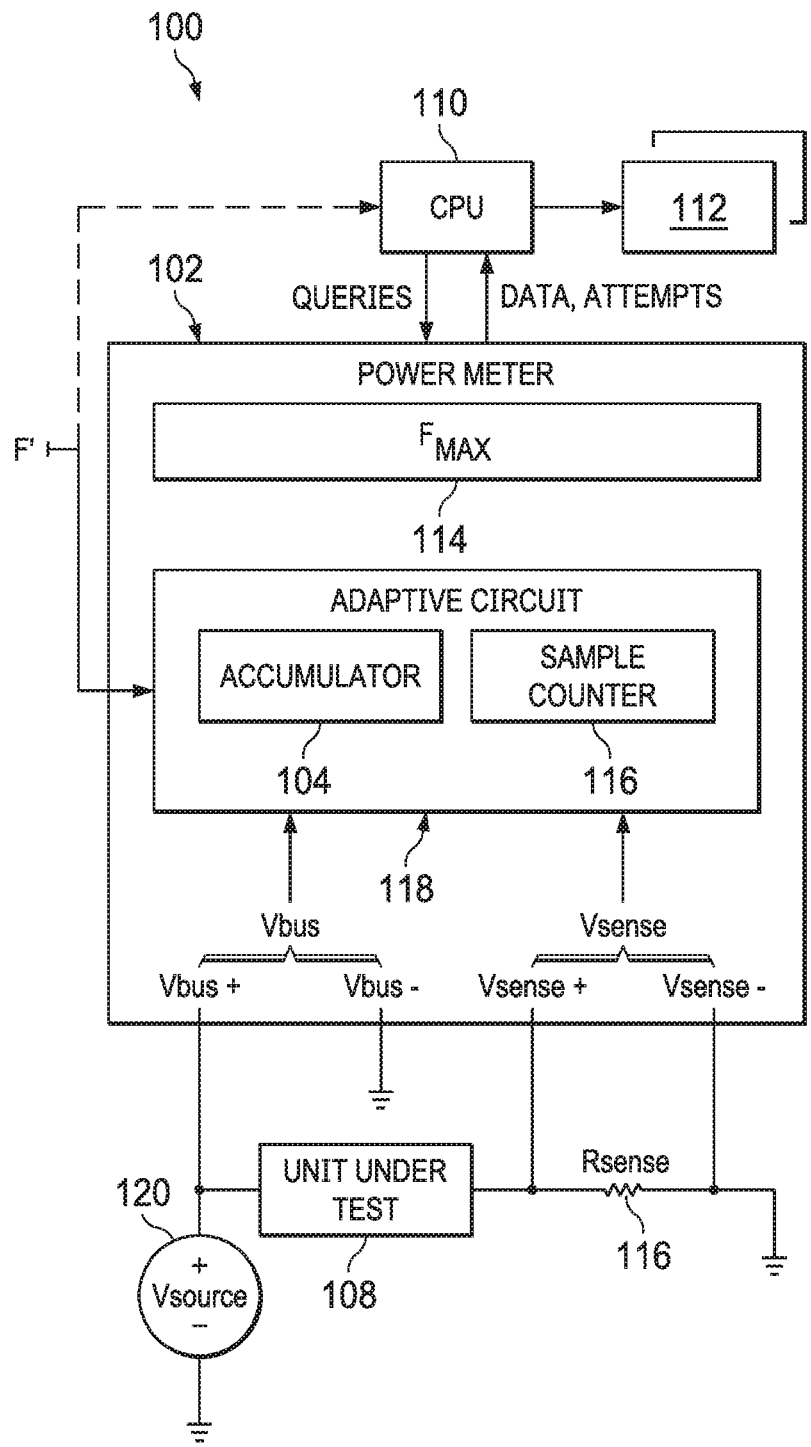

FIGS. 1A and 1B are illustrations of a system 100 for adaptive power measurement accumulation with a changing sampling frequency, according to embodiments of the present disclosure. System 100 may include any suitable number or combination of elements. For example, system 100 may include a power meter 102, a sense resistor 106, a CPU 110, a unit under test 108, and other entities 112. System 100 may be implemented within, for example, a mobile device, tablet, computer, server, laptop, test equipment, battery, power supply, consumer appliance, automotive electronics, or any other suitable electronic device. In FIG. 1A, system 100 may perform high side sensing of current passing into unit under test 108. In FIG. 1B, system 100 may perform low side sensing of current passing from unit under test 108.

Power meter 102 may be implemented as a semiconductor device, field-programmable gate array, application-specific integrated circuit, module, or other circuit, including implementation by analog circuitry, digital circuitry, combinatorial logic, circuitry manifested by instructions or a hardware description language, instructions for execution by a processor, or any combination thereof. In one embodiment, power meter 102 may include an adaptive circuit 118. Adaptive circuit 118 may be configured to adaptively modify information for electrical measurements based upon a changing sampling frequency. The electrical measurements may include any suitable measurement, such as voltage measurements, power measurements, or manipulations of such measurements as part or all of a process to yield information from other measurements. For example, the electrical measurements may be scaled, filtered, or used in steps of calculations. In a further example, such calculations may include a power product, wherein one voltage measurement may be multiplied by another voltage measurement, wherein the power product may be further used to calculate power once the power product is divided by a resistance value. Adaptive circuit 118 may be implemented by analog circuitry, digital circuitry, combinatorial logic, circuitry manifested by instructions or a hardware description language, instructions for execution by a processor, or any combination thereof. An example implementation of adaptive circuit 118 is illustrated in more detail within the context of FIG. 2, below. Adaptive circuit 118 may include an accumulator 104. Accumulator 104 may include a register, data storage location, or any other suitable mechanism for storing a value. Accumulator 104 may be configured to store an accumulated sum of any suitable electrical measurements or manipulations thereof, such as power products from measurements of unit under test 108. The value in accumulator 104 may be referred to as PACC. In another embodiment, adaptive circuit 118 may include a sample counter 116. Sample counter 116 may include a counter, register, data storage location, or any other suitable mechanism for storing a value. Sample counter 116 may be configured to store a quantification of a number of samples for which accumulator 104 has stored measurements of power of unit under test 108. The value in sample counter 116 may be referred to as $S_{count}$. In yet another embodiment, power meter 102 may include an indication of a maximum sampling frequency ($f_{max}$) 114 with which power meter 102 may sample measurements of power of unit under test 108. $f_{max}$ 114 may be stored in any suitable manner, such as a register or hard-coded value. In another embodiment, an element accessing power meter 102 such as CPU 110 may know, a priori, $f_{max}$ 114. The element may know a value of $f_{max}$ 114 without having to access the value within power meter 102 based on, for example, a model, make, or other identifier of power meter 102.

CPU 110 may be implemented by any suitable processor, microcontroller, or other suitable mechanism. In one embodiment, as shown in FIG. 1, CPU 110 may be implemented within system 100. However, in other embodiments, CPU 110 may be implemented outside system 100 and communicatively coupled to power meter 102. CPU 110 may be configured to load and execute or interpret instructions as part of a script, executable, application, library, function call, or other suitable software.

Sense resistor 106 may be implemented by a resistor of any suitable known resistance value. The resistance of sense resistor 106 may be given as $R_{sense}$, and is preferably known, or provided to CPU 110 and power meter 102, a-priori.

Unit under test 108 may include any suitable portion of system 100, including an electronic device such as a mobile device, tablet, computer, server, laptop, test equipment, battery, power supply, consumer appliance, or automotive electronics, or portion thereof.

Other entities 112 may include users, memories, subsystems, processors, or other portions of system 100. In one embodiment, other entities 112 may be implemented within system 100 as shown in FIG. 1. However, in other embodiments, other entities 112 may be implemented outside system 100 yet communicatively coupled to CPU 110.

CPU 110 may be configured to execute software, firmware, or other instructions to determine energy used by, provided to, or discharged by unit under test 108 from data from or reported by power meter 102. CPU 110 may execute such software on behalf of, for example, other entities 112. CPU 110 may be configured to determine the energy used by, provided to, or discharged from unit under test 108 and provide the determination to other entities 112 on request, issue alerts or information about the determination to other entities 112, or take any other suitable corrective action. For example, CPU 110 may determine an energy level of a smartphone battery in unit under test 108 at least partially based on data provided by power meter 102 and display such an energy level as a percentage on a display of the smartphone in other entities 112. CPU 110 may be configured to gather accumulated measurements from power meter 102, perform calculations, accumulate measurements or calculations into larger data pools, perform data logging, or display data. Measurements and calculations may be saved by CPU 110 into an appropriate memory or registers.

Power meter 102 may be configured to measure power provided to, or discharged from, unit under test 108. Power meter 102 may be configured to do so by taking a series of samples of voltage. For a given sample at an instant in time, power meter 102 may be configured to make two voltage measurements for unit under test 108. The two voltage measurements may be referred to as Vbus and Vsense. These may be sampled and converted to digital values. Vbus may be the voltage provided to the series combination of sense resistor 106 and unit under test 108. In other embodiments (not shown), Vbus may be the voltage provided across unit under test 108. Vsense may be the voltage across resistor 106. Current through unit under test 108 may be the same as current through resistor 106. Thus, current through unit under test 108 may be given as Vsense/$R_{sense}$. A determination of power flowing through the combination of unit under test 108 and resistor 106 may thus be Vbus*Vsense/$R_{sense}$. However, division operations may be less efficient in power meter 102 than in CPU 110. Thus, in power meter 102, Vbus and Vsense may be multiplied together to yield a power product that is to later be divided by $R_{sense}$ in CPU 110 by software. The instantaneous power products of Vsense*Vbus may be each added to accumulator 104.

Vbus and Vsense may be measured in any suitable manner. For example, a voltage source 120 with a voltage, Vsource, may be applied to unit under test 108. In FIG. 1A, voltage source 120 may be applied through resistor 106 to a first end of unit under test 108. Unit under test 108 may be connected to ground at a second end. In FIG. 1A, Vsense may be measured by a connection between a Vsense+ pin and a first end of resistor 106 and by a connection between a Vsense– pin and a second end of resistor 106. In FIG. 1A, Vbus may be measured by a connection between a Vbus+ pin and the first end of resistor 106 and by a connection between a Vbus– pin and ground. In FIG. 1B, voltage source 120 may be applied directly to the first end of unit under test 108. At a second end, unit under test 108 may be connected to resistor 106, which may in turn be connected to ground. In FIG. 1B, Vsense may be measured by a connection between a Vsense+ pin and a first end of resistor 106 and by a connection between a Vsense– pin and a second end of resistor 106, or ground. In FIG. 1B, Vbus may be measured by a connection between a Vbus+ pin and a first end of unit under test 108 and by a connection between a Vbus– pin and ground. In FIGS. 1A and 1B, Vbus may represent the voltage across the entire series combination of resistor 106 and unit under test 108. Thus, Vbus may represent the voltage as applied by voltage source 120 and the actual value of Vsource. In FIGS. 1A and 1B, Vsense may represent the voltage across resistor 106 alone. In FIG. 1A, power meter 102 may be configured to measure power provided to a series combination of sense resistor 106 and unit under test 108. In FIG. 1B, power meter 102 may be configured to measure power discharged by the series combination of sense resistor 106 and unit under test 108. In an implementation such as FIG. 1A, the number of pins of power meter 102 to measure Vbus and Vsense may be reduced by using a single pin for both Vsense+ and Vbus+. Furthermore, the number of pins of power meter 102 to measure Vbus and Vsense may be reduced by connecting a Vbus– connection internally in power meter 102 to ground. Similarly, in an implementation such as FIG. 1B, the number of pins of power meter 102 to measure Vbus and Vsense may be reduced by connecting a Vbus– connection internally in power meter 102 to ground. The power consumed by sense resistor 106 may be typically negligible in relation to the power received by, or consumed by, unit under test 108, and thus may be ignored. Alternatively, measurement of Vbus can be done directly across unit under test 108, thus measuring only the power received by, or consumed by, unit under test 108.

Power meter 102 may be configured to use sampling frequencies between a minimum sampling frequency to maximum sampling frequency, $f_{max}$ 114. Power meter 102 may include an internal clock to perform such sampling or be configured to receive an external clock to perform such sampling. Such a clock may be used to time the sampling. The maximum sampling frequency, $f_{max}$ 114, may be the frequency of such a clock. Power meter 102 may be configured to sample at the maximum sampling frequency, $f_{max}$ 114, by default.

In one embodiment, during measurement of power from unit under test 108, a sampling frequency used by power meter 102 may be changed. This may be represented in FIG. 1 by a signal, f'. Signal f' may be implemented by any suitable signal to indicate a changed frequency. For example, signal f' may specify a particular frequency for power meter 102 to use, or signal f' may be a binary signal to specify that power meter 102 is to switch to a second, different frequency. Signal f' may be generated from any suitable source, such as from power meter 102 itself, other entities 112, another module, subsystem, or part of system 100, automatically from a sensor, and on any suitable condition or time. For example, sampling operations may itself require energy or generate heat. If a temperature sensor determines that system 100 has reached a threshold temperature, the temperature sensor may issue signal f' to instruct power meter 102 to sample at a lower frequency. In another example, signal f' may be generated by unit under test 108 based upon a condition wherein power provided to or discharged from unit under test 108 does not change frequently. Thus, slower sampling by power meter 102 may be sufficient to accurately track energy of unit under test 108 on behalf of other entities 112. In yet another example, accumulator 104 may be of a fixed size, and may overflow given a sampling frequency of $f_{max}$ 114 and a time for which samples are to be taken. In such a case, in order to preserve testing requirements of the time for which samples are to be taken, signal f' may be asserted so as to reduce the sampling frequency and evaluate unit under test 108 without overflowing accumulator 104.

Signal f' may be changed at power meter 102 with notification to CPU 110 in that CPU 110 also receives signal f'. Signal f' may be changed without notification to CPU 110 in that CPU 110 does not know, or does not use, the specific time at which signal f' is received. In some embodiments, signal f' may be routed to CPU 110 or even issued from CPU 110, but the time at which signal f' is so routed to CPU 110 or issued from CPU 110 is not recorded, known, or used by CPU 110, or not needed to be recorded, known, or used by CPU 110 for CPU 110 to make its measurement calculation from the value provided by power meter 102, accumulator 104, and sample counter 116. In one embodiment, adaptive circuit 118 may be configured to adaptively adjust values collected in accumulator 104 and sample counter 116 upon receipt of signal f'. The adaptively adjusted values may allow CPU 110 to not need to be aware of the change in sampling frequency indicated by signal f' at the time of the reception of signal f'. The adaptively adjusted values may allow CPU 110 to maintain its processing steps to calculate energy as the sampling frequency changes. Embodiments of the present disclosure may, by way of adaptive circuit 118, provide consistent energy information from power meter 102 to CPU 110 even as the sampling frequency is changed for hardware at power meter 102 without notification to CPU 110. This may simplify the software requirements for calculating energy while using multiple sampling frequencies that were changed without notification to CPU 110. Furthermore, this may remove any need to interrupt or wake CPU 110 with signal f' or a related signal. In addition, this may remove a need for CPU 110 to, upon a change to sampling frequency during measurements by power meter 102, subsequently instruct power meter 102 to save data from accumulator 104 and sample counter 116 and then reset accumulator 104 and sample counter 116. CPU 110 may have reduced system overhead and management tasks for power meter 102. Neither CPU 110 nor power meter 102 might be required to save the data from accumulator 104 and reset accumulator 104 upon receipt of signal f'.

The sampling frequency of power meter 102 may be adjusted to any suitable value. For example, the sampling frequency might be reduced from 1024 samples per second (sps) to 8 sps upon receipt of signal f'.

Other entities 112 may request or have use for information about the energy used by unit under test 108. In response to such a request or use for information, CPU 110 may issue a query, command, interrupt, or other signal to power meter 102. The query may be to start recording information from unit under test 108. The query may be to measure voltage for a certain number of samples, a certain amount of time, and at a default or other specified sampling frequency. The default sampling frequency may be $f_{max}$ 114. In response to such an issued query, command, interrupt, or other signal received by power meter 102 from CPU 110, power meter 102 may reset accumulator 104, sample counter 116, and begin recording samples. Power meter 102 may continue to record samples in successive cycles for the specified number of samples or time. Upon completion of sampling, power meter 102 may provide notice to CPU 110 in any suitable manner, such as an interrupt or other signal. CPU 110 may read data such as PACC or $S_{count}$ from power meter 102 directly or through the use of commands or queries. CPU 110 may reset accumulator 104 and sample counter 116.

In one embodiment, $f_{max}$ 114 may be provided to CPU 110 in response to a query, or CPU 100 may know, a priori, $f_{max}$ 114. In another embodiment, $S_{count}$ may be provided to CPU 110 in response to a query. As explained further below, CPU 110 may be configured to determine $f_{max}$ 114 from such an $S_{count}$. In yet another embodiment, PACC may be provided to CPU 110 in response to a query.

In one embodiment, PACC may be used to calculate the energy of unit under test 108. In another embodiment, PACC may be used to calculate the average power of unit under test 108. In yet another embodiment, $S_{count}$ may be used to calculate $f_{max}$ 114, which may in turn be used to calculate the energy of unit under test 108. In still yet another embodiment, $S_{count}$ may be used to calculate the average power of unit under test 108. PACC and $S_{count}$ may be maintained by adaptive circuit 118 over changes in sampling frequency that are made without notification to CPU 110, that have been adapted to allow CPU 110 to calculate the appropriate values without reference to changes in sampling frequency.

The accumulated power product, PACC, created from measurements of voltages of unit under test 108 and resistor 106 may be converted to an energy determination in software by multiplying the accumulated power product, PACC, by the sample time ($1/f_s$), wherein $f_s$ is the sampling frequency used by power meter 102:

$$E = \frac{1}{R_{sense}} * \sum_{k=0}^{S_{count}} Vbus_k * Vsense_k * \frac{1}{f_s}$$

which may be simplified as $$E = \frac{1}{R_{sense}} * \frac{1}{f_s} * (PACC)$$

CPU 110 may be configured to use this energy equation to determine energy provided to or discharged by unit under test 108 over a given time period.

As discussed above, during measurements of unit under test 108, the sampling frequency may change. In one embodiment, adaptive circuit 118 may be configured to adaptively generate PACC across the different sampling frequencies that are used. As a result, the value of PACC provided by adaptive circuit 118 of power meter 102 may allow CPU 110 to use the above equation for energy, whether signal f' is received during any time during sampling or signal f' is not received. By doing so, adaptive circuit 118 may prevent a need for software on CPU 110 to first compute and record the accumulated energy up to the time of the sampling frequency change, then reset the accumulator, then record the accumulated energy at a different sampling frequency at the end of the measurement. For example, if signal f' is received at some moment in time $T_{slow}$, changing the sampling frequency from $f_{max}$ 114 to $f_{slow}$, the total energy equation might be given as:

$$E = E_{fmax} + E_{fslow}$$

$$E = \frac{1}{R_{sense}} *$$

$$\left\{ \left( \sum_{k=0}^{S_{Tslow}} Vbus_k * Vsense_k * \frac{1}{f_{max}} \right) + \left( \sum_{k=S_{Tslow}+1}^{S_{count}} Vbus_k * Vsense_k * \frac{1}{f_{slow}} \right) \right\}$$

$$E = \frac{1}{R_{sense}} * \left\{ \left( \frac{1}{f_{max}} * PACC_{smax} \right) + \left( \frac{1}{f_{slow}} * PACC_{slow} \right) \right\}$$

wherein the number of samples taken before signal f' is received at time $T_{slow}$ is given by $S_{Tslow}$, $PACC_{Smax}$ is the value of accumulator 104 containing the sum of power products from the beginning until time $T_{slow}$ when signal f' is received, and $PACC_{slow}$ is the value of accumulator 104 containing the sum of power products from time $T_{slow}$ when f' is received until the end of sampling, $E_{fmax}$ is the energy measured from the beginning of the measurement time until signal f' is received and $E_{fslow}$ is the energy measured from the time signal f' is received until the end of the measurement period.

Accordingly, without adaptive circuit 118, at the moment $T_{slow}$ the software of CPU 110 would need to compute $E_{fmax}$ using the samples accumulated in accumulator 104 up to that point in time (given by $PACC_{Smax}$), save such an energy calculation, reset accumulator 104 and sample counter 116, replace $1/f_{max}$ with $1/f_{slow}$ for the next energy computation, and compute $E_{fslow}$ using the samples accumulated in accumulator 104 from time $T_{slow}$ until the end of the measurement period (given by $PACC_{slow}$). This requirement to calculate separate energy calculations for time periods involving different sampling frequencies and to reset accumulator 104 in between taking measurements for such time periods may be prevented by embodiments of the present disclosure.

CPU 110 may be configured to determine $f_{max}$ 114 from an $S_{count}$ provided by adaptive circuit 118. Given a measurement interval starting at T1 and ending at T2, $$fmax = \frac{Scount}{T2 - T1}$$

In some embodiments, CPU 110 may be configured to calculate $f_{max}$ 114 from $S_{count}$ rather than simply assume $f_{max}$ 114 or obtain $f_{max}$ 114 from power meter 102. CPU 110 may be configured to calculate $f_{max}$ 114 when, for example, CPU 110 has a more reliable clock than power meter 102, and thus the accuracy of T2-T1 may allow for a more accurate determination of the actual $f_{max}$ utilized by power meter 102. Furthermore, CPU 110 may be configured to calculate $f_{max}$ 114 when CPU 110 has more reliable timestamps than power meter 102. In addition, CPU 110 may be configured to calculate $f_{max}$ 114 when a sample clock of power meter 102 has a frequency that has drifted due to temperature or otherwise deviates from specifications. Timestamps of commands used to start and stop measurements at T1 and T2 on CPU 110 may be used. CPU 110 may have a reliable clock or timestamps when CPU 110 is implemented as an embedded system or with firmware. CPU 110 might not have a more reliable clock or timestamps than power meter 102 when CPU 110 is executing a general-purpose operating system with a complex stack that may be interrupted for a variety of non-critical tasks. In one embodiment, adaptive circuit 118 may be configured to adaptively generate $S_{count}$ across the different sampling frequencies that are used. As a result, the value of $S_{count}$ provided by adaptive circuit 118 and power meter 102 may allow CPU 110 to use the above equation for $f_{max}$ calculation, whether signal f' is received at any time during sampling or signal f' is not received. To calculate $f_{max}$, CPU 110 may use $S_{count}$ from adaptive circuit 118, with T1 defined as the initiation of sampling, and T2 defined as the end of sampling.

Without such an adaptively generated $S_{count}$ value provided by adaptive circuit 118, for a first sampling frequency, CPU 110 would otherwise have to instruct power meter 102 to start measurements, instruct power meter 102 to stop measurements when the first sampling frequency changes, and use the $S_{count}$ value returned for such as a first period of time. Then CPU 110 would have to reset $S_{count}$, instruct power meter 102 to start measurements again, instruct power meter 102 to stop measurements, and use the new $S_{count}$ value for the second period of time.

CPU 110 may be configured to determine an average power of unit under test 108 from the returned values of PACC and $S_{count}$. For example:

$$P_{AVG} = \frac{1}{R_{sense}} * PACC * \frac{1}{S_{count}}$$

wherein the accumulated power product, PACC, is divided by the counter value and divided by value of $R_{sense}$.

As discussed above, during measurements of unit under test 108, the sampling frequency may change. In one embodiment, power meter 102 may be configured to adaptively generate $S_{count}$ and PACC across the different sampling frequencies that are used. As a result, power meter 102 may provide $S_{count}$ and PACC such that the above equation for average power may be used by CPU 110. Without such adaptively generated $S_{count}$ and PACC values, for a first sampling frequency, CPU 110 would otherwise have to instruct power meter 102 to start measurements, instruct power meter 102 to stop measurements when the first sampling frequency changes, and use the $S_{count}$ and PACC values returned for such as a first period of time. This further requires that power meter 102 receive an interrupt or query from CPU 110 in a timely manner and act rapidly in response thereto so as to retrieve values for $S_{count}$ and PACC in response to queries from CPU 110 before additional measurements are accumulated. Then CPU 110 would have to reset $S_{count}$ and PACC, instruct power meter 102 to start measurements again, instruct power meter 102 to stop measurements, and use the new $S_{count}$ and PACC values for the second period of time. Then, the two average power calculations would themselves be averaged.

Figure 2:
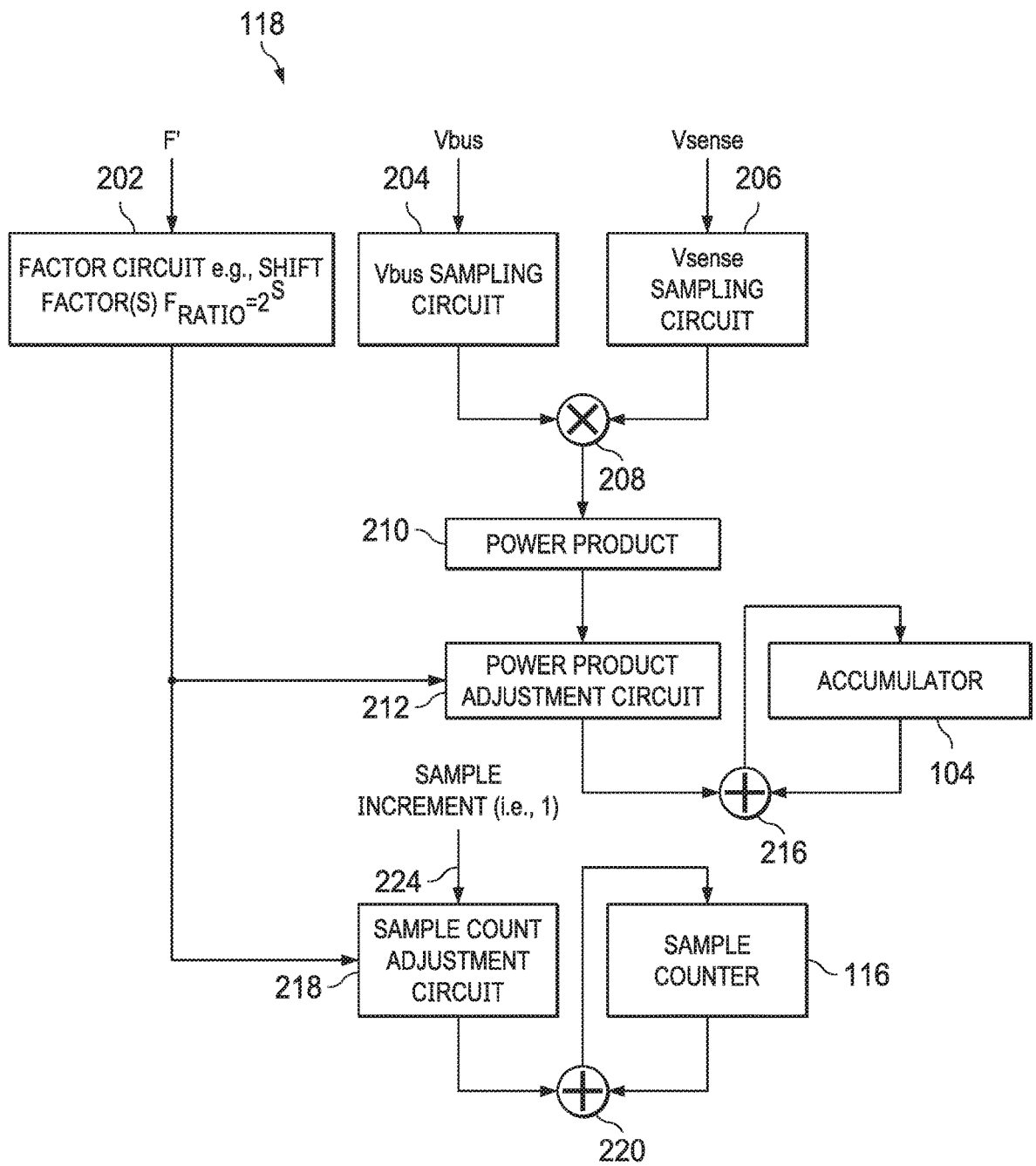
FIG. 2 is a more detailed illustration of portions of a power meter, according to embodiments of the present disclosure.

FIG. 2 is a more detailed illustration of portions of power meter 102 for adaptively generating PACC and $S_{count}$, according to embodiments of the present disclosure. In particular, FIG. 2 may illustrate an example implementation of adaptive circuit 118.

Samples may be taken of Vbus and Vsense. Vbus and Vsense may be sampled by one or more sampling circuits. Vbus sampling circuit 204 may be configured to sample Vbus. Vsense sampling circuit 206 may be configured to sample Vsense. Vbus sampling circuit 204 and Vsense sampling circuit 206 may be implemented by any suitable combination of analog and digital circuitry, such as by a sample-and-hold circuit. Although shown as separate circuits, Vbus sampling circuit 204 and Vsense sampling circuit 206 may be implemented as a single circuit. The samples of Vbus and Vsense may be multiplied by a multiplier 208. This may yield a power product that is stored in a register, power product 210, for the sample in question.

In one embodiment, rather than simply adding the content of power product 210 to an existing value of accumulator 104, adaptive circuit 118 may adjust the content of power product 210 based upon any changed sampling frequency. Thus, power meter 102 may adaptively generate a value of accumulator 104 across different sampling frequencies.

In one embodiment, adaptive circuit 118 may include a power product adjustment circuit 212 to adaptively generate a value for addition to accumulator 104 by adjusting the content of power product 210. Power product adjustment circuit 212 may be implemented by any suitable combination of analog circuitry, digital circuitry, or instructions for execution by a processor. Power product adjustment circuit 212 may be configured to apply a ratio of different sampling frequencies to content of power product 210.

A ratio of different sampling frequencies may be determined in any suitable manner. In one embodiment, adaptive circuit 118 may include a factor circuit 202. Factor circuit 202 may be implemented in any suitable manner, such as by a look-up table, register, or by any suitable combination of analog circuitry, digital circuitry, or instructions for execution by a processor. Factor circuit 202 may be configured to, given reception of signal f', determine a factor by which the sampling frequency has been increased or decreased between the reception of signal f' and the initial frequency, such as $f_{max}$.

In one embodiment, the sampling frequencies may be factors of 2, such as 1, 2, 4, 8, 16 . . . . In such an embodiment, the ratio between any two sampling frequencies may be given as $$F_{ratio} = 2^S$$

wherein S is an exponent expressing a quantification of the ratio of sampling frequencies according to the above equation. Furthermore, in such an embodiment, S may express a number of bits by which power product 210 is to be shifted by power product adjustment circuit 212. Thus, in such an embodiment, power product adjustment circuit 212 may be implemented by a shift circuit. For positive values of S, wherein $f_{slow}$, i.e., the sampling frequency to be used in response to receipt of signal f', is less than $f_{max}$, power product adjustment circuit 212 may be implemented as a left shift circuit. Bits of power product 210 may be shifted left a number of times equal to S. Power product adjustment circuit 212 may thus act as a multiplier of power product 210 times $2^S$.

In other embodiments, the sampling frequencies may be related by expressions other than $2^S$. In such embodiments, factor circuit 202 may be configured to provide the ratio of sampling frequency and power product adjustment circuit 212 may be configured to adjust power product 210 so that the result is adjusted according to the ratio. For example, if the ratio may be powers of 10. In such a case, power product adjustment circuit 212 may be implemented with multiplication operations sufficient to scale power product 210 according to the ratio.

If signal f' has not been received, the power product adjustment circuit 212 might take no action on power product 210.

After power product 210 is optionally adjusted by power product adjustment circuit 212, the result may be added to the existing value of accumulator 104 by adder 216. The result may be stored back into accumulator 104. Similar to the adaptive generation of a value of accumulator 104 across different sampling frequencies, in one embodiment, rather than simply adding a single value to sample counter 116 during each sample of voltages, power meter 102 may adjust a sample increment 224 based upon any changed sampling frequency. Thus, adaptive circuit 118 may adaptively generate a value of sample counter 116 across different sampling frequencies.

Sample increment 224 may be, by default, one. In one embodiment, adaptive circuit 118 may include a sample count adjustment circuit 218 configurated to adaptively generate an incremented value for sample counter 116 by sample increment 224. Sample count adjustment circuit 218 may be implemented by any suitable combination of analog circuitry, digital circuitry, or instructions for execution by a processor. Sample count adjustment circuit 218 may be configured to adjust sample increment 224 by a factor generated by factor circuit 202, such as S. Sample count adjustment circuit 218 may be implemented as a shift circuit wherein S expresses a number of bits by which sample increment 224 is to be shifted by sample count adjustment circuit 218. Sample count adjustment circuit 218 may be implemented as a left shift circuit wherein $f_{slow}$ is less than the original sampling frequency by a factor of two. If signal f' has not been received, sample count adjustment circuit 218 might take no action on sample increment 224, and provide sample increment 224 unadjusted.

After sample increment 224 is optionally adjusted by sample count adjustment circuit 218, the result may be added to the existing value of sample counter 116 by adder 220. The result may be stored back into sample counter 116.

Accordingly, adaptive circuit 118 may be configured to adaptively generate a PACC value in accumulator 104 that may be used even if generated with multiple sampling frequencies. If the initial frequency is $f_{max}$ and the second frequency triggered by signal f' is given as $f_{slow}$, which may be slower than $f_{max}$, then $$Fratio = \frac{f_{max}}{f_{slow}}$$

and $$f_{max} = Fratio * f_{slow}$$

and $$f_{slow} = \frac{f_{max}}{Fratio}$$

Taking the equation for energy above and substituting for $f_{slow}$ $$E = \frac{1}{R_{sense}} *$$

$$\left\{ \left( \sum_{k=0}^{S_{T_{slow}}} Vbus_k * Vsense_k * \frac{1}{f_{max}} \right) + \left( \sum_{k=S_{T_{slow}}+1}^{S_{count}} Vbus_k * Vsense_k * \frac{1}{f_{slow}} \right) \right\}$$

-continued $$E = \frac{1}{R_{sense}} * \left\{ \left( \sum_{k=0}^{S_{T_{slow}}} Vbus_k * Vsense_k * \frac{1}{f_{Smax}} \right) + \left( \sum_{k=S_{T_{slow}}+1}^{S_{count}} Vbus_k * Vsense_k * \frac{Fratio}{f_{Smax}} \right) \right\}$$

$$E = \frac{1}{R_{sense}} * \frac{1}{f_{Smax}} * \left\{ \left( \sum_{k=0}^{S_{T_{slow}}} Vbus_k * Vsense_k \right) + \left( \sum_{k=S_{T_{slow}}+1}^{S_{count}} Vbus_k * Vsense_k * Fratio \right) \right\}$$

$$E = \frac{1}{R_{sense}} * \frac{1}{f_{Smax}} * \{(PACC_{Smax}) + (Fratio * PACC_{slow})\}$$

$$E = \frac{1}{R_{sense}} * \frac{1}{f_{max}} * PACC$$

Returning to FIG. 1, thus, CPU 110 may simply use PACC, the value of accumulator 104 when sampling has finished, to compute the energy of unit under test 108, even when different sampling frequencies have been used to generate PACC. If an initial sampling frequency was lower than $f_{max}$, such a sampling frequency may be substituted into the above equation, as long as factor circuit 202 accounts for a difference between such a sampling frequency and $f_{slow}$. There might be no need for CPU 110 to detect the moment $T_{slow}$, react to reception of signal f', compute and save $E_{fmax}$, and reset accumulator 104 and sample counter 116. The same energy computation formula above applies, regardless of whether the sampling frequency was constant or whether it changed before data was read by CPU 110. In fact, the sampling frequency may change multiple times. Values may be stored in accumulator 104 as-if $f_{max}$ (or another set frequency) was used for all the samples. There may be no requirement that only the particular sampling frequencies discussed herein be used, as the technique may be used for any suitable frequencies for whom ratios can be calculated.

Control of power accumulation calculations may be simplified. With the adaptive implementation of updating accumulator 104 and sample counter 116, sampling frequency changes are handled automatically in power meter 102 and CPU 110 might not need to read accumulator 104 and sample counter 116 each time the sampling frequency changes. This may result in a reduction to system overhead with fewer bus traffic and commands such as interrupt, wake, or refresh commands to synchronize data. Furthermore, this may result in simplifying calculations by CPU 110. Simpler software to execute on CPU 110 may yield less CPU time consumed, less power consumption, less storage required for program memory in embedded applications, and less interaction required between CPU 110 and power metering chips such as power meter 102. In addition, this may result in less power consumption, as CPU 110 may be asleep or off during measurement by power meter 102. Furthermore, this may result in a need for fewer connections on CPU 110 to receive signal f'. Accumulated data of accumulator 104 and sample counter 116 may be consistent across sampling frequency changes, yielding no need to save the data of accumulator 104 and sample counter 116 and reset these before a conversion cycle with the new sampling frequency, as the data for accumulator 104 and sample counter 116 may be independent of the sampling frequency.

Figure 3:
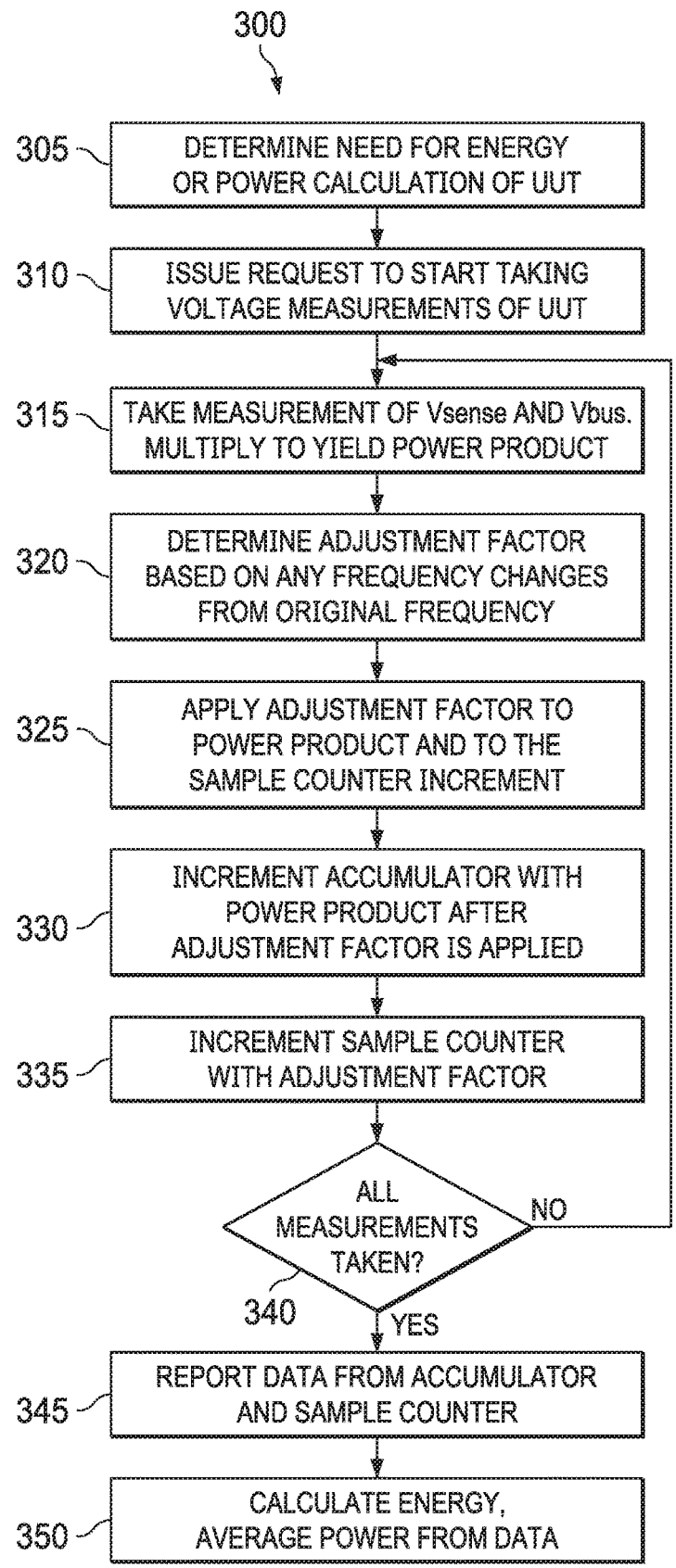
FIG. 3 is an illustration of a method for adaptive power measurement accumulation with a changing sampling frequency, according to embodiments of the present disclosure.

FIG. 3 is an illustration of an example method 300 for adaptive power measurement accumulation with a changing sampling frequency, according to embodiments of the present disclosure. Method 300 may be performed by any suitable entity, such as the elements of FIGS. 1-2. Method 300 may include more or fewer steps than shown in FIG. 3. The steps of method 300 may be optionally repeated, omitted, performed in a different order, or performed recursively in various embodiments. Method 300 may repeat as many times as necessary, and may begin or terminate on any suitable criteria, such as a command, based upon a setting, or other suitable criteria.

At step 305, a need for power measurements of a unit under test may be determined or identified. The need may be made as part of a specific query, or may be an ongoing or recurring need. The need may be determined by software or firmware running on a CPU.

At step 310, the CPU may issue a request to take power measurements of a unit under test. The request may be made to a power meter.

At step 315, the power meter may take measurements of suitable voltages or currents of the unit under test. For example, the power meter may take voltage measurements across a sense resistor connected to the unit under test as well as take voltage measurements across the unit under test. The voltage measurements may be multiplied to yield a power product. Each set of voltage measurements and resulting power product may be initially made for a given sample. The sampling frequency may change, without notification to the CPU, at any suitable time during method 300.

At step 320, the power meter may determine an adjustment factor. The adjustment factor may be computed as the ratio between the maximum sampling frequency and the present sampling frequency, if the sampling frequency has changed. The sampling frequency may be adjusted upon receipt of the signal f'. At step 325, the power meter may apply the adjustment factor to the power product and to the sample counter increment. If the sampling frequency is the same as the original sampling frequency, the adjustment factor may have no effect on the power product. At step 330, an accumulator may be incremented with the power product as-adjusted by the adjustment factor of step 325. At step 335, a sample counter may be incremented as-adjusted by the adjustment factor. If the sampling frequency is the same as the original sampling frequency, the sample counter may be incremented by one.

At step 340, it may be determined whether all measurements have been taken. If so, method 300 may proceed to step 345. Otherwise, method 300 may repeat at, for example, step 315.

At step 345, data from the accumulator and the sample counter may be reported to, for example, the CPU. At step 350, the CPU may perform calculations, such as energy or average power of the unit under test, with the data from the accumulator and the sample counter.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

The invention claimed is:

1. An apparatus, comprising:
   a sampling circuit to initially make electrical measurements of a unit under test at a first sampling frequency;
   an adaptive circuit; and
   an accumulator to accumulate electrical measurements of the unit under test from the sampling circuit including a plurality of first electrical measurements at the first sampling frequency;
   wherein, after a change in sampling frequency from the first sampling frequency to a second sampling frequency:
     the sampling circuit is to make a plurality of second electrical measurements at the second sampling frequency;
     the adaptive circuit is to adjust a value of the plurality of second electrical measurements from the sampling circuit according to a factor, wherein the factor is a multiplication factor, the factor based on a relationship between the first sampling frequency and the second sampling frequency, to yield a plurality of adjusted second electrical measurements; and
     the accumulator is to accumulate the plurality of adjusted second electrical measurements with the first electrical measurements.

2. The apparatus of claim 1, wherein the accumulator is to accumulate the plurality of adjusted second electrical measurements made at the second sampling frequency with the plurality of first electrical measurements made at the first sampling frequency without resetting a value of the accumulator.

3. The apparatus of claim 1, comprising a sample counter to:
   initially accumulate a count of the plurality of electrical measurements made by the sampling circuit at the first sampling frequency; and
   after a change from the first sampling frequency to the second sampling frequency, accumulate the count of the plurality of second electrical measurements made by the sampling circuit at the second sampling frequency, the count of the plurality of second electrical measurements made by the sampling circuit at the second sampling frequency adjusted by the factor.

4. The apparatus of claim 1, wherein the adaptive circuit is to receive an indication that the plurality of second electrical measurements are to be made at the second sampling frequency instead of the first sampling frequency.

5. The apparatus of claim 4, wherein the adaptive circuit is to receive the indication that the plurality of second electrical measurements are to be made at the second sampling frequency instead of the first sampling frequency without notification to a central processing unit, the central processing unit to use a value of the accumulator.

6. The apparatus of claim 1, wherein the accumulator is to provide a single value of accumulated electrical measurements, the accumulated electrical measurements including electrical measurements made with both the first sampling frequency and the second sampling frequency.

7. The apparatus of claim 1, wherein:
   the adaptive circuit includes a shift circuit;
   the factor is given as $2^S$, wherein $2^S$ is equal to a ratio of the first sampling frequency to the second sampling frequency; and
   the shift circuit is to shift an accumulated value of electrical measurements by S bits.

8. A method, comprising
with a sampling circuit, initially making electrical measurements of a unit under test at a first sampling frequency including a plurality of first electrical measurements at the first sampling frequency;
with an accumulator, accumulating electrical measurements of the unit under test;
with an adaptive circuit, determining a change in sampling frequency from the first sampling frequency to a second sampling frequency;
with the sampling circuit, making a plurality of second electrical measurements at the second sampling frequency after determining the change in sampling frequency;
with the adaptive circuit, adjusting a value of the second electrical measurements according to a factor, wherein the factor is a multiplication factor, the factor based on a relationship between the first sampling frequency and the second sampling frequency, to yield a plurality of adjusted second electrical measurements; and
with the accumulator, accumulating the plurality of adjusted second electrical measurements with the plurality of first electrical measurements.

9. The method of claim 8, comprising accumulating the plurality of adjusted second electrical measurements made at the second sampling frequency with the plurality of first electrical measurements made at the first sampling frequency without resetting a value of accumulation.

10. The method of claim 8, comprising:
maintaining a sample count;
initially accumulating a count of the plurality of first electrical measurements made at the first sampling frequency in the sample count; and
after a change from the first sampling frequency to the second sampling frequency, accumulating the count of the plurality of second electrical measurements made at the second sampling frequency in the sample count, the count of the plurality of second electrical measurements made at the second sampling frequency adjusted by the factor.

11. The method of claim 8, comprising receiving an indication that electrical measurements are to be made at the second sampling frequency instead of the first sampling frequency.

12. The method of claim 11, comprising receiving the indication that electrical measurements are to be made at the second sampling frequency instead of the first sampling frequency without notification to a central processing unit, the central processing unit to use a value of the accumulator.

13. The method of claim 8, comprising providing a single value of accumulated electrical measurements, the accumulated electrical measurements including electrical measurements made with both the first sampling frequency and the second sampling frequency.

14. The method of claim 8, wherein:
the adjustment is performed with a shift circuit;
the factor is given as $2^S$, wherein $2^S$ is equal to a ratio of the first sampling frequency to the second sampling frequency; and
the method comprises using the shift circuit to shift an accumulated value of electrical measurements by S bits.

15. A system, comprising:
a processor; and
a power meter, including:
a sampling circuit to initially make electrical measurements of a unit under test at a first sampling frequency;
an adaptive circuit; and
an accumulator to accumulate electrical measurements of the unit under test from the sampling circuit including a plurality of first electrical measurements at the first sampling frequency;
wherein, after a change in sampling frequency from the first sampling frequency to a second sampling frequency:
the sampling circuit is to make a plurality of second electrical measurements at the second sampling frequency;
the adaptive circuit is to adjust a value of the plurality of second electrical measurements from the sampling circuit according to a factor, wherein the factor is a multiplication factor, the factor based on a relationship between the first sampling frequency and the second sampling frequency, to yield a plurality of adjusted second electrical measurements;
the accumulator is to accumulate the plurality of adjusted second electrical measurements; and
the accumulator is to provide an accumulation of adjusted second electrical measurements to the processor with the first electrical measurements.

16. The system of claim 15, wherein the accumulator is to accumulate the plurality of adjusted second electrical measurements made at the second sampling frequency with the plurality of first electrical measurements made at the first sampling frequency without resetting a value of the accumulator.

17. The system of claim 15, comprising a sample counter to:
initially accumulate a count of the plurality of first electrical measurements made by the sampling circuit at the first sampling frequency; and
after a change from the first sampling frequency to the second sampling frequency, accumulate the count of the plurality of second electrical measurements made by the sampling circuit at the second sampling frequency, the count of the plurality of second electrical measurements made by the sampling circuit at the second sampling frequency adjusted by the factor.

18. The system of claim 15, wherein the adaptive circuit is to receive an indication that electrical measurements are to be made at the second sampling frequency instead of the first sampling frequency.

19. The system of claim 18, wherein the adaptive circuit is to receive the indication that electrical measurements are to be made at the second sampling frequency instead of the first sampling frequency without notification to the processor.

20. The system of claim 15, wherein the accumulator is to provide a single value of accumulated electrical measurements, the accumulated electrical measurements including electrical measurements made with both the first sampling frequency and the second sampling frequency.

* * * * *